(12) United States Patent
Minich (10) Patent No.: US 8,920,194 B2
(45) Date of Patent: Dec. 30, 2014

(54) CONNECTION FOOTPRINT FOR ELECTRICAL CONNECTOR WITH PRINTED WIRING BOARD

(75) Inventor: Steven E. Minich, York, PA (US)

(73) Assignee: FCI Americas Technology Inc., Carson City, NV (US)

(*) Notice: Subject to any disclaimer, the term of this patent is extended or adjusted under 35 U.S.C. 154(b) by 344 days.

(21) Appl. No.: 13/484,774

(22) Filed: May 31, 2012

(65) Prior Publication Data

US 2013/0005160 A1 Jan. 3, 2013

Related U.S. Application Data

(60) Provisional application No. 61/503,680, filed on Jul. 1, 2011.

(51) Int. Cl.
*H01R 13/648* (2006.01)
*H01R 13/6471* (2011.01)
*H01R 12/73* (2011.01)
*H01R 13/658* (2011.01)

(52) U.S. Cl.
CPC .......... *H01R 13/6471* (2013.01); *H01R 12/737* (2013.01); *H01R 13/65807* (2013.01)
USPC .................................................... 439/607.05

(58) Field of Classification Search
CPC ........................ H01R 23/688; H01R 13/6471
USPC ........................................ 439/607.05, 607.06
See application file for complete search history.

(56) References Cited

U.S. PATENT DOCUMENTS

| | | | |
|---|---|---|---|
| 7,137,832 B2 | 11/2006 | Mongold et al. | |
| 7,503,804 B2 | 3/2009 | Minich | 439/608 |
| 7,621,781 B2 | 11/2009 | Rothermel et al. | |
| 7,762,843 B2 | 7/2010 | Minich et al. | 439/607.05 |
| 7,862,344 B2* | 1/2011 | Morgan et al. | 439/67 |
| 7,883,367 B1* | 2/2011 | Kline | 439/607.05 |
| 7,901,248 B2* | 3/2011 | Lappoehn | 439/607.05 |
| 7,905,751 B1* | 3/2011 | Davis | 439/607.05 |
| 7,967,637 B2* | 6/2011 | Fedder et al. | 439/607.06 |
| 8,016,616 B2* | 9/2011 | Glover et al. | 439/607.05 |
| 8,231,411 B1* | 7/2012 | Westman et al. | 439/607.05 |
| 8,251,745 B2* | 8/2012 | Johnescu et al. | 439/607.1 |
| 2003/0008561 A1* | 1/2003 | Lappoehn | 439/608 |
| 2006/0068641 A1 | 3/2006 | Hull et al. | |

(Continued)

OTHER PUBLICATIONS

"Strada Whisper High Speed Backplane Connector system", Tyco Electronics Corporaton, Mar. 24, 2010, 15 pgs.

*Primary Examiner* — Ross Gushi
(74) *Attorney, Agent, or Firm* — Harrington & Smith (57) ABSTRACT

An electrical connector including a housing; ground contacts; and signal contacts. The signal contacts are differential signal pairs. The electrical connector is a right angle connector. First ends of the ground contacts are in a center row. First ends of a first one of the each differential signal pair are on a first side row at a first side of the center row. First ends of a second one of the differential signal pairs are on a second side row at a second opposite side of the center row. At least one of the first ends of the ground contacts is provided between the first ends of two of the differential signal pairs. An assembly is provided including the electrical connector and a printed circuit board having the electrical connector mounted thereon. The printed circuit board includes through-holes with a shared single antipad one of the differential signal pair.

20 Claims, 11 Drawing Sheets

(56) References Cited

U.S. PATENT DOCUMENTS

| | | | |
|---|---|---|---|
| 2006/0228912 A1* | 10/2006 | Morlion et al. | 439/65 |
| 2007/0099507 A1* | 5/2007 | Ohnishi et al. | 439/608 |
| 2008/0096424 A1* | 4/2008 | Bixler et al. | 439/608 |
| 2009/0017681 A1* | 1/2009 | Amleshi et al. | 439/608 |
| 2009/0117781 A1* | 5/2009 | Johnescu et al. | 439/626 |
| 2009/0149041 A1* | 6/2009 | Morlion et al. | 439/65 |
| 2009/0191756 A1* | 7/2009 | Hull et al. | 439/607.05 |
| 2009/0291592 A1* | 11/2009 | Bixler et al. | 439/607.05 |
| 2009/0311908 A1* | 12/2009 | Fogg et al. | 439/607.05 |
| 2010/0015822 A1* | 1/2010 | Morgan et al. | 439/83 |
| 2010/0304581 A1* | 12/2010 | Davis et al. | 439/65 |
| 2011/0070753 A1* | 3/2011 | Davis | 439/108 |
| 2011/0130038 A1 | 6/2011 | Cohen et al. | |
| 2011/0159744 A1* | 6/2011 | Buck | 439/660 |
| 2011/0189868 A1* | 8/2011 | Kirk | 439/74 |
| 2011/0207342 A1* | 8/2011 | Davis | 439/65 |
| 2011/0212649 A1* | 9/2011 | Stokoe et al. | 439/626 |
| 2011/0275249 A1* | 11/2011 | Cartier et al. | 439/660 |
| 2012/0003848 A1* | 1/2012 | Casher et al. | 439/65 |
| 2012/0244753 A1* | 9/2012 | Moedinger | 439/626 |
| 2012/0270420 A1* | 10/2012 | Lapidot | 439/65 |
| 2013/0005160 A1* | 1/2013 | Minich | 439/65 |
| 2013/0052843 A1* | 2/2013 | Johnescu et al. | 439/95 |

\* cited by examiner

CONNECTION FOOTPRINT FOR ELECTRICAL CONNECTOR WITH PRINTED WIRING BOARD

CROSS REFERENCE TO RELATED APPLICATION

This application claims the benefit under 35 USC 119(e) of U.S. Provisional Patent Application No. 61/503,680 filed Jul. 1, 2011 which is hereby incorporated by reference in its entirety.

BACKGROUND

1. Technical Field

The exemplary and non-limiting embodiments of the invention relate generally to an electrical connector and, more particularly, to a connection footprint.

2. Brief Description of Prior Developments

Electrical connectors with Insert Molded Leadframe Assemblies (IMLAs) having ground contacts and differential signal pairs are known in the art, such as described in U.S. Pat. Nos. 7,503,804 and 7,762,843 which is hereby incorporated by reference in its entirety.

SUMMARY

The following summary is merely intended to be exemplary. The summary is not intended be limiting.

In accordance with one aspect, an electrical connector is provided comprising a housing; a plurality of ground contacts connected to the housing; and a plurality of signal contacts connected to the housing, where the signal contacts comprise differential signal pairs. The ground and signal contacts each comprise first ends at a first side of the housing and opposite second ends at a second side of the housing to form a right angle connector. The first ends comprise a first group of three generally parallel rows including the first ends of the ground contacts in a center row, the first ends of a first one of the signal contacts of each differential signal pair of the group on a first side row at a first side of the center row, and first ends of a second one of the signal contacts of the differential signal pairs of the group on a second side row at a second opposite side of the center row, where at least one of the first ends of the ground contacts is provided between the first ends of two of the differential signal pairs of the group. The first ends and the housing are configured to be directly mounted to a daughter printed circuit board. The second ends and the housing are configured to removably connect to a mating electrical connector on a mother printed circuit board.

In accordance with another aspect, an assembly is provided comprising a daughter printed circuit board comprising rows of electrical connector contact holes in a group; and an electrical connector directly mounted to the daughter printed circuit board. The electrical connector comprises ground contacts and signal contacts. The signal contacts form a plurality of differential signal pairs. First ends of the ground and signal contacts are provided at a first side of the electrical connector and project into the electrical connector contact holes of the printed circuit board. The printed circuit board comprises a single antipad at two of the contact holes for each of the differential signal pairs. Each of the antipads has a general elongated shape. The general elongate shape of each of the antipads in one row of the antipads is generally perpendicular to the general elongated shape of a corresponding one of the antipads in an adjacent row of the antipads.

In accordance with another aspect, a method comprises providing a daughter printed circuit board comprising rows of electrical connector contact holes; and connecting a right angle electrical connector to the daughter printed circuit board, where the right angle electrical connector is mounted to the daughter printed circuit board with first ends of ground and signal contacts of the electrical connector being located in respective ones of the electrical connector contact holes, where the signal contacts form a plurality of differential signal pairs, where the daughter printed circuit board is provided with a single antipad at two of the holes for each of the differential signal pairs, where each of the antipads has a general elongate shape, where the general elongate shape of the antipads at one of the rows of holes is generally perpendicular to the antipads at an adjacent one of the rows of holes.

BRIEF DESCRIPTION OF THE DRAWINGS

The foregoing aspects and other features are explained in the following description, taken in connection with the accompanying drawings, wherein.

DETAILED DESCRIPTION OF EMBODIMENTS

Figure 1:
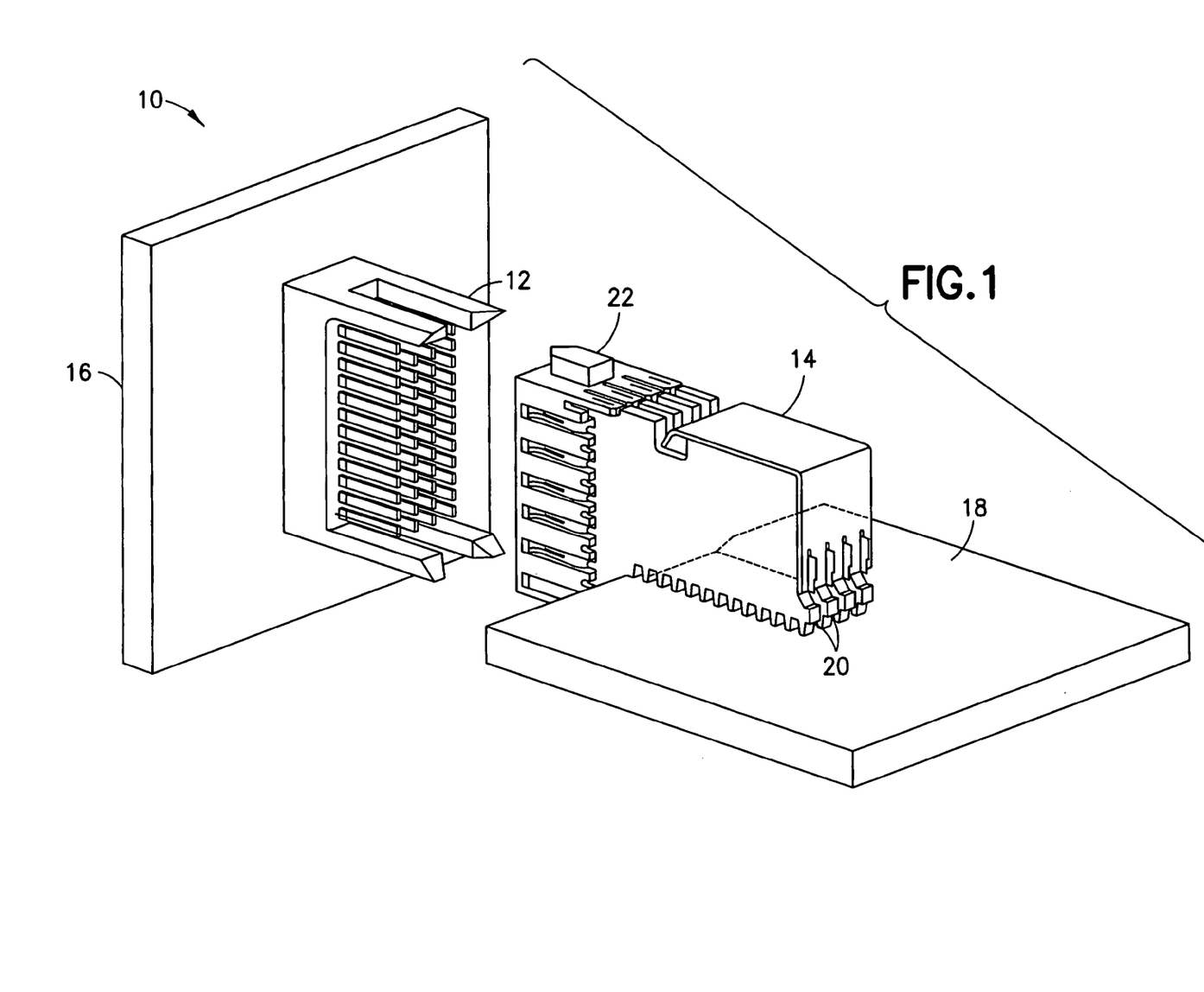
FIG. 1 is a perspective view of connectors and components used to make an assembly.

Referring to FIG. 1, an assembly 10 is shown, partially separated, which comprises features of an example embodiment. Although features will be described with reference to the example embodiments shown in the drawings, it should be understood that features can be embodied in many alternate forms of embodiments. In addition, any suitable size, shape or type of elements or materials could be used.

The assembly 10 generally comprises two electrical connectors 12, 14 which are used to removably connect two components 16, 18 (such as printed circuit boards for example) to each other. In this example, the first connector 12 is a backpanel connector, and the second connector 16 is a right angle connector. However, in alternate embodiments the connectors 12, 14 could be any suitable right angle or vertical type of connector. In this example, both connectors have contacts which comprise through-hole mounting posts to be located in holes of the printed circuit boards 16, 18. However, in alternate embodiments the contacts might comprise other types of component connection areas, such as surface mounted contact areas.

Figure 2:
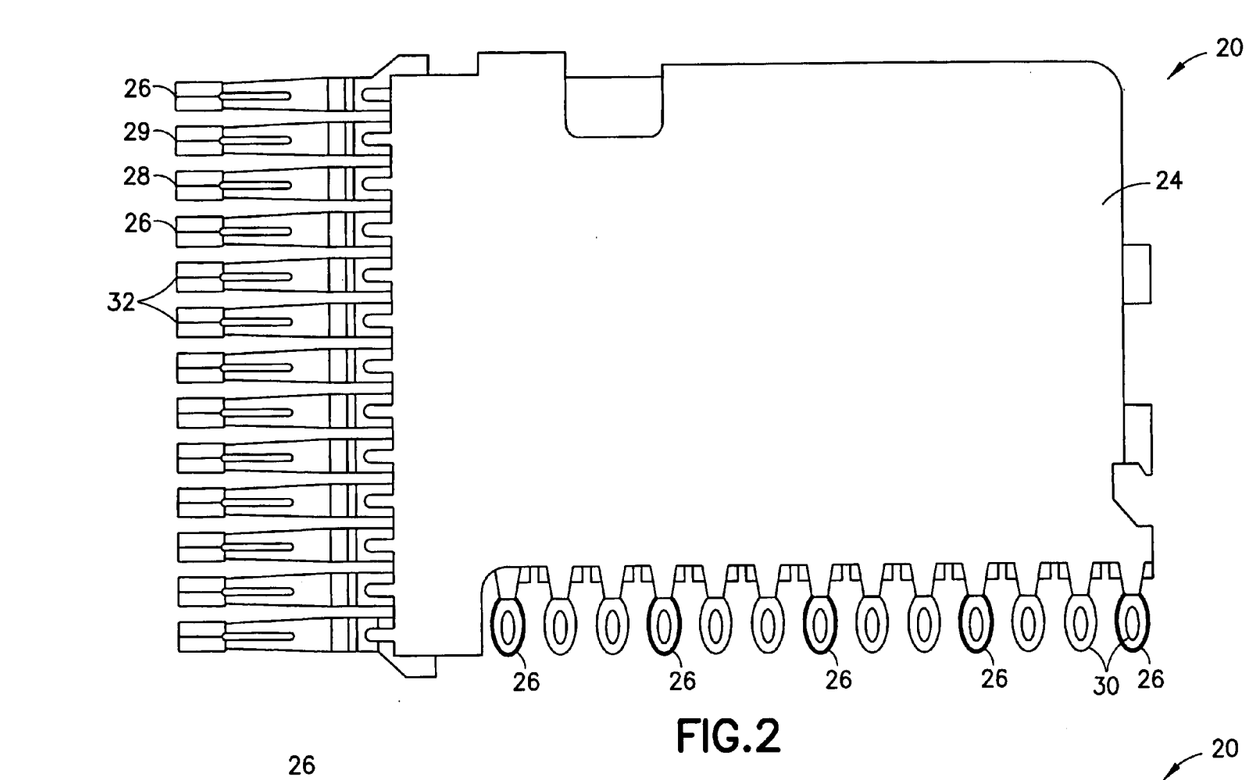
FIG. 2 is a side view of one of the IMLAs used to make one of the connectors shown in FIG. 1.
Figure 3:
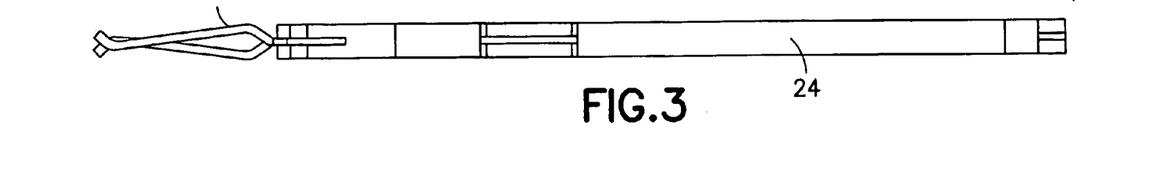
FIG. 3 is a top plan view of the IMLA shown in FIG. 2.

Referring also to FIGS. 2-3, the second connector 14 in this example embodiment comprises a plurality of Insert Molded Leadframe Assemblies (IMLAs) assembled on a front housing 22. However, in alternate embodiments IMLA subassemblies might not be used. Each IMLA comprises a frame 24 which is insert molded onto ground contacts 26 and signal contacts 28, 29. The contacts 26, 28, 29 are preferably made of sheet metal, which has been stamped and formed into a leadframe which subsequently is used to form the IMLA. The signal contacts 28, 29 are provided as differential signal pairs S−, S+. Each contact has a first end 30 and a second end 32. The first ends 30 are located at a first side of the connector 14. The second ends 32 are located at a second side of the connector 14 to provide a right angle connector. In this example the right angle connector 14 is a receptacle connector with deflectable beams at the second ends 32. However, in an alternate embodiment the right angle connector could be a header connector with male contact blades at the second ends 32. The first ends 30 comprise press-fit tails, solder tails, surface mount leads, solderless compliant leads, or posts.

Figure 4:
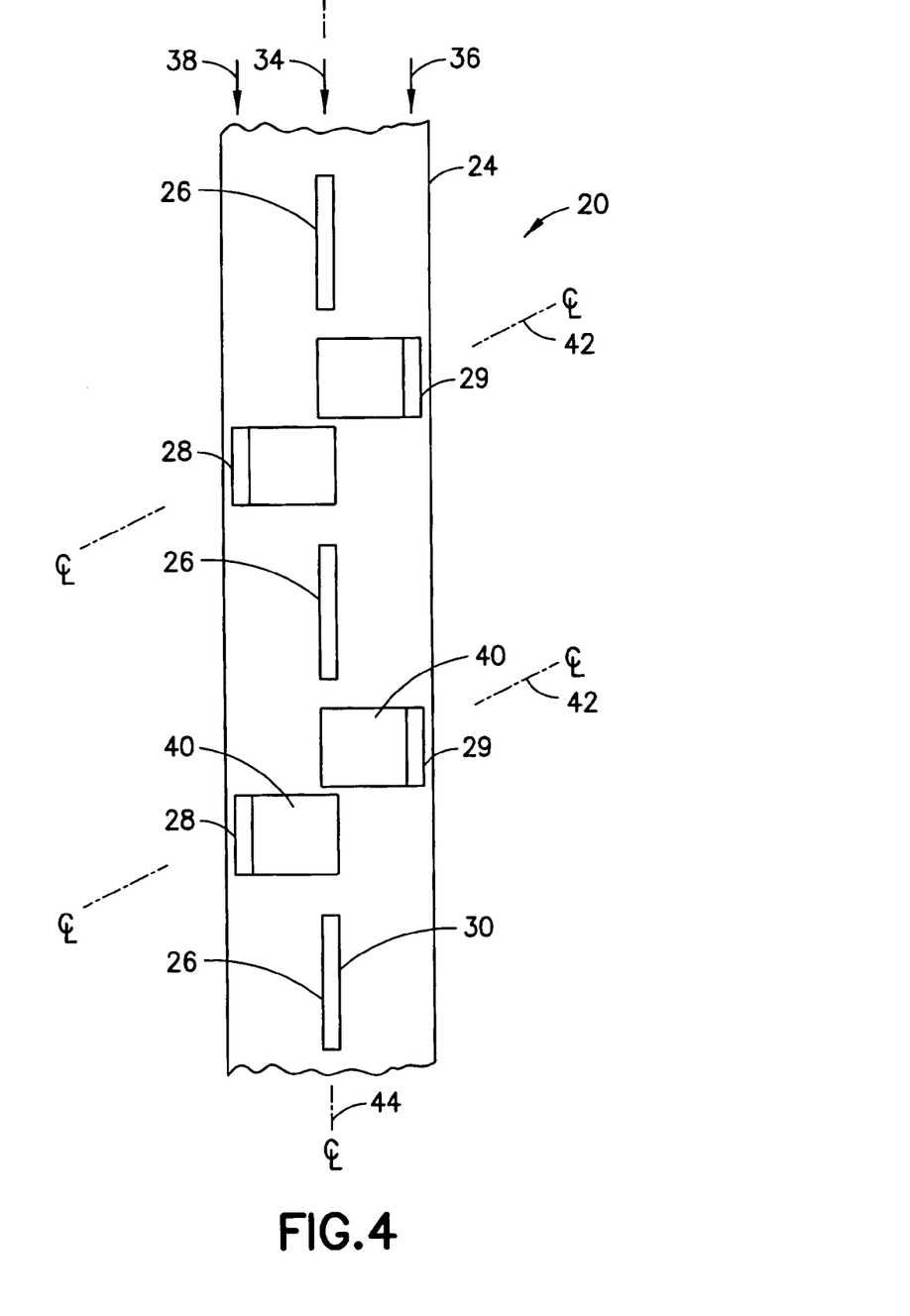
FIG. 4 is a bottom plan view of a portion of the IMLA shown in FIGS. 2-3.
Figure 4A:
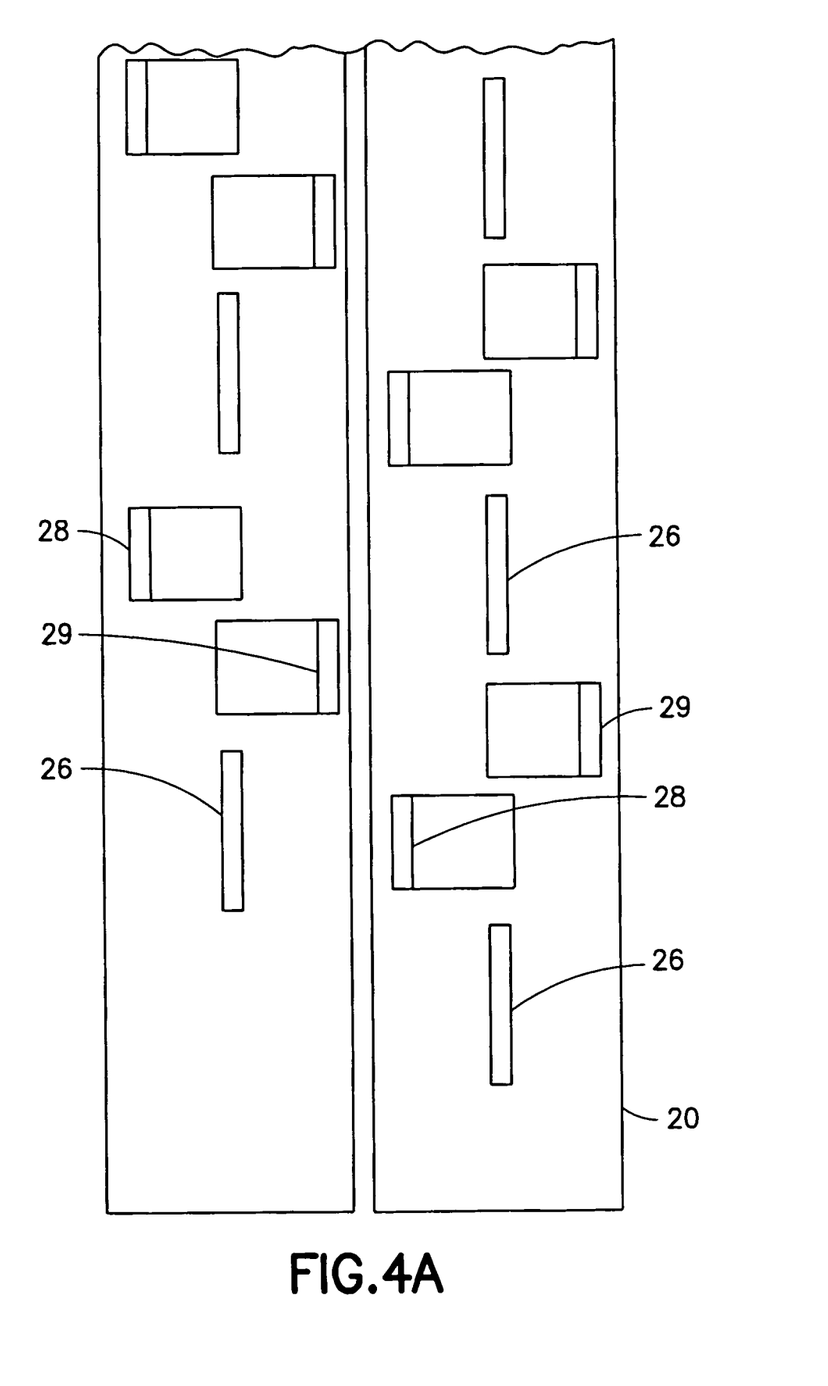
FIG. 4A is a bottom plan view illustrating portions of two side-by-side IMLA.
Figure 5:
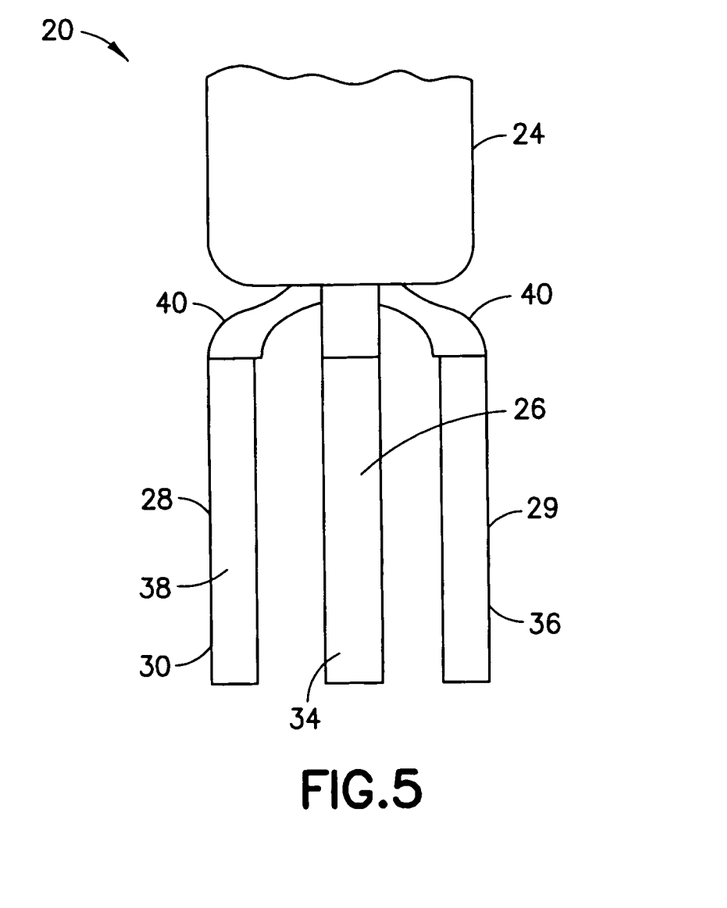
FIG. 5 is an end view of the first ends of the contacts of the IMLA shown in FIGS. 2-4.

Referring also to FIGS. 4, 4A and 5, each IMLA has the first ends 30 arranged in three rows; a center row 34, a first side row 36 and an opposite second side row 38. The first ends 30 of the ground contacts 26 extend straight from the frame 24 and form the center row 34. One of the ground contacts' first ends are positioned between two of pairs of first ends of each of the differential signal pairs 28, 29. Each of the differential signal pairs 28, 29 have one first end in the first side row 36 and the other first end in the second side row 38. Each signal contact has a bent section 40 to transition from being at the center of the bottom side of the frame 24 to being in the two lateral spaced rows 36, 38. The first ends of the signal contacts 28, 29 are, thus, longer in length from the frame 24 than the first ends of the ground contacts 26.

As seen in FIG. 4, the first ends 30 of each differential signal pair 28, 29 are separated from an adjacent pair 28, 29 by a first end 30 of one of the ground contacts 26. The ground contacts 26 also have a first end 30 at each outer end of the rows. The first ends 30 of each differential signal pair are aligned with each other along an axis 42 which is angled relative to the longitudinal axis 44 of the IMLA 20 and ground contact first ends. In the example embodiment shown, the angle is about 45 degrees. However, in an alternate example embodiment the angle might be between 20-70 degrees.

Figure 6:
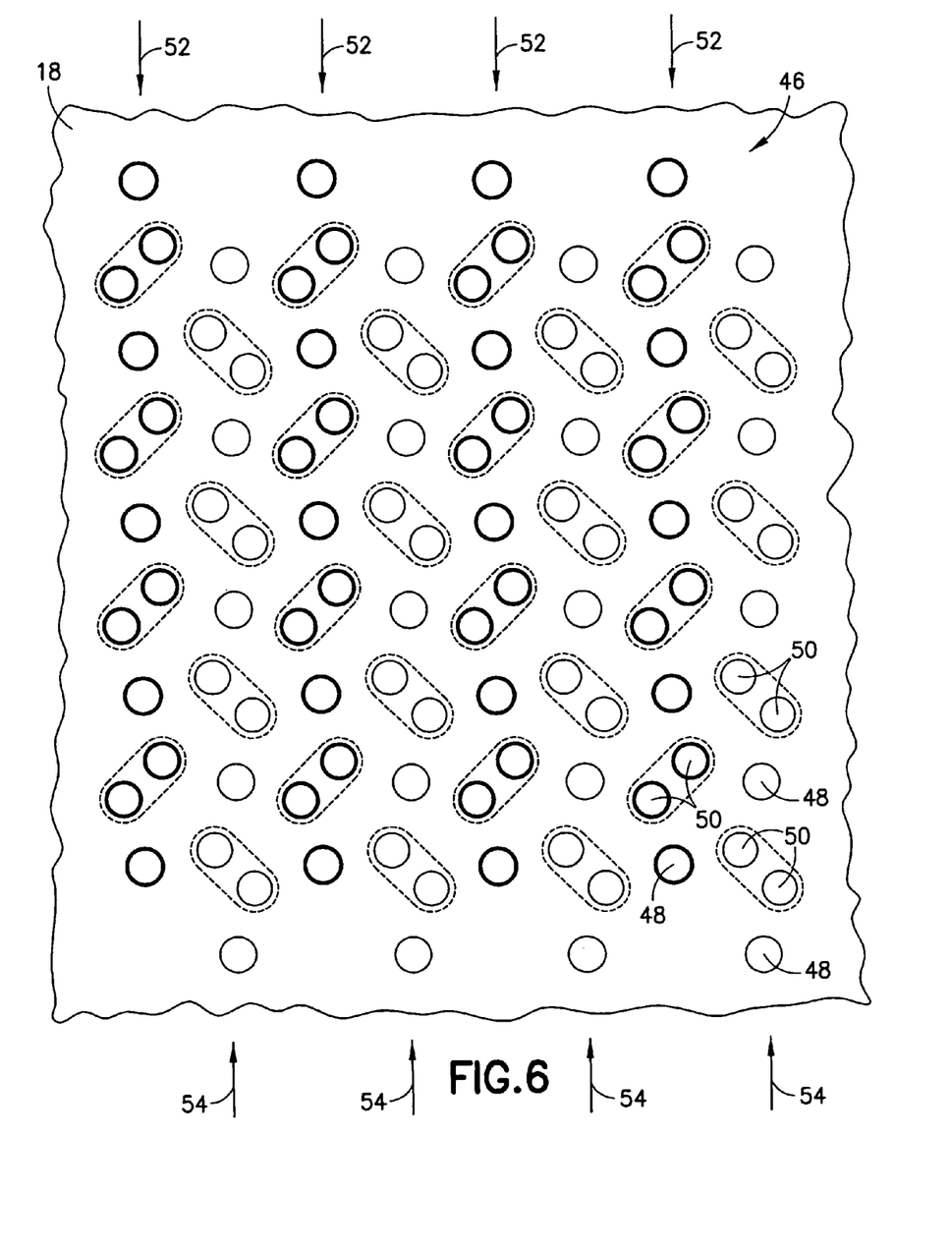
FIG. 6 is a top plan view of a portion of the daughter printed circuit boards shown in FIG. 1.

Referring also to FIG. 6, a top plan view of a portion of the daughter printed circuit board 18 is shown. The board 18 has an area 46 for connecting the electrical connector 14. The area 46 has a plurality of through-holes 48, 50 for receiving the first ends 30 of the contacts 26, 28, 29. In this example the through-holes are arranged in a particular pattern corresponding to the pattern of the first ends 30 of the contacts 26, 28, 29 in the IMLAs 20 of the connector 14. In this example the connector 14 has eight (8) of the IMLAs. Thus, the area 46 has eight (8) corresponding rows 52, 54 of the through-holes 48, 50.

Figure 7:
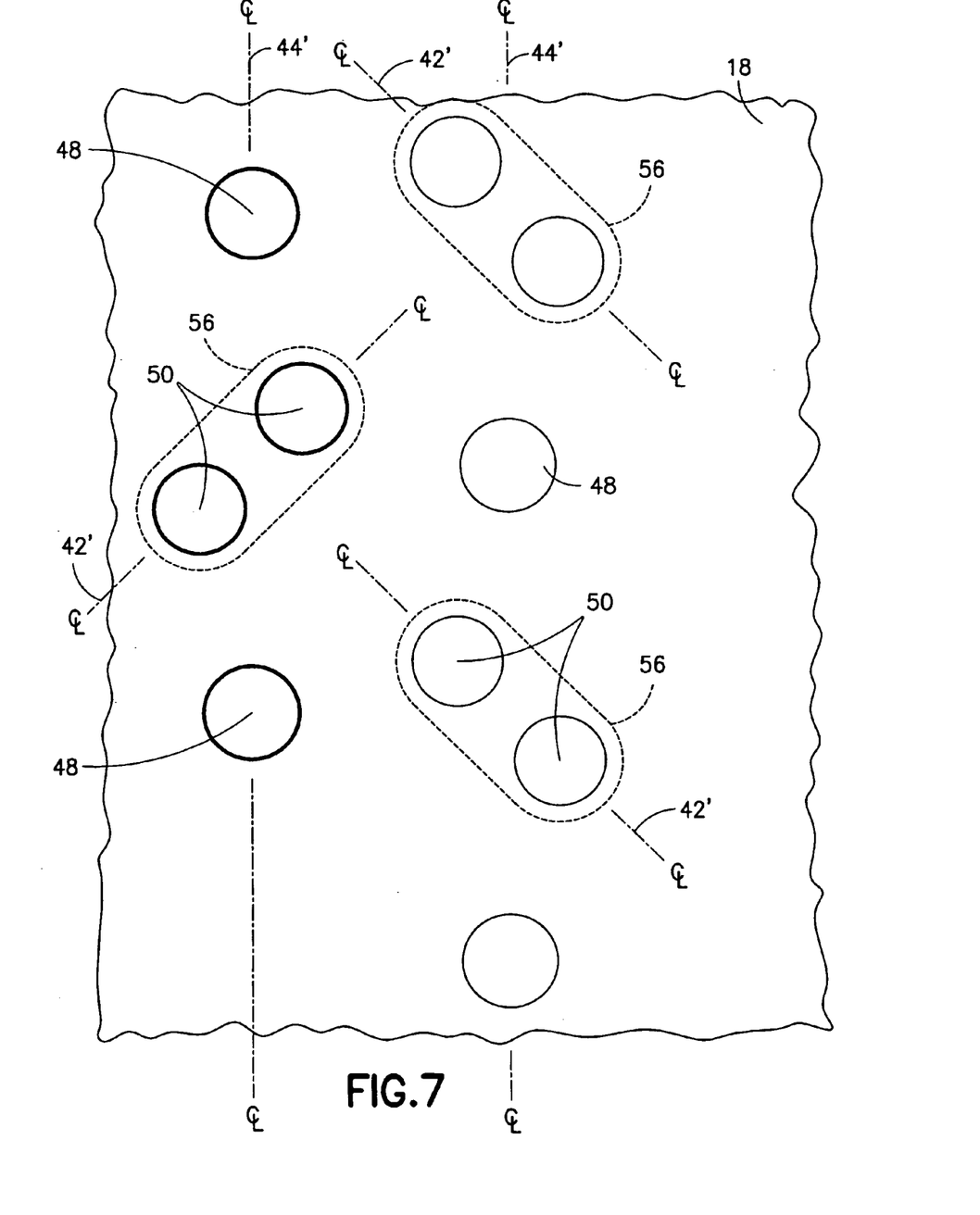
FIG. 7 is an enlarged view of a portion of the daughter printed circuit board shown in FIG. 6.

Referring also to FIG. 7, the first through-holes 48 are larger than the second through-holes 50 in this example. These larger size through-holes 48 accommodate the larger size of the first ends of the ground contacts 26. The second through-holes 50 are sized and shaped to have the smaller size first ends of the signal contacts 28, 29 press-fit therein. The second through-holes 50 are provided in pairs in each row along an axis 42'. Each axis 42' is angled relative to the centerline 44' of its corresponding row by an angle of about 45 degrees. However, in an alternative example the angle might be between 20-70 degrees.

In this example embodiment, each pair of differential signal pair through-holes 50 has a single antipad 56. Each antipad 56 has a general elongated oval shape, or any other suitable shape, as shown in the drawings. The general elongated oval shape is aligned along the centerline axis 42'. The centerlines 42' of the differential signal pair through-holes 50 in each row are parallel to each other. However, the centerlines 42' of the differential signal pair through-holes 50 in adjacent rows are generally orthogonal to each other. In an alternate embodiment the angle might be more or less than 90 degrees.

Figure 8:
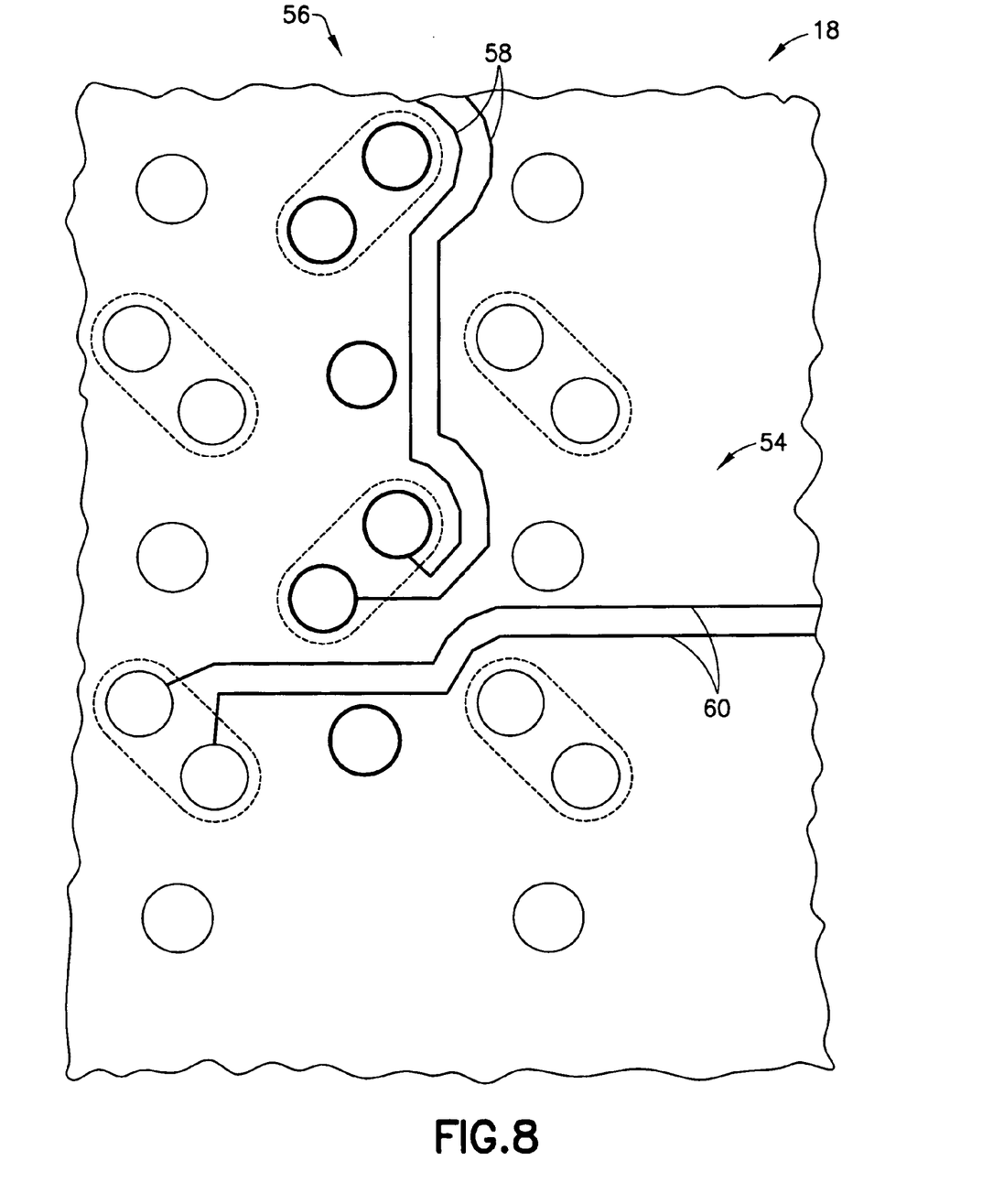
FIG. 8 is a top plan view of a portion of the board shown in FIGS. 6-7 showing examples of routing channels.

Referring also to FIG. 8, one feature which can be used on the daughter printed circuit board 18 with this type of through-hole and antipad design is in regard to conductor routing channels from the second through-holes 50 for each of the differential signal pairs 28, 29. The printed circuit board 18 may have pairs of conductor routing channels 58, 60 from the through-holes 50 which extend from at least two generally orthogonal sides 62, 64 of the group of through-holes, or footprint, such that lateral routing is provided.

The example shown in the drawings illustrates a daughter card PCB layout that allows for theoretical zero footprint crosstalk and also permits bi-directional trace routing. This footprint also offers higher signal density than existing designs. Previous orthogonal midplace footprint designs did not permit routing at all and did not apply to daughter cards. This concept can be used with the next generation 40 Gbps Backpanel connectors, and provides a PCB footprint for a High Speed Backpanel Connector.

The pair pitch within a row may be two times (2×) the column pitch (pitch between rows) to allow for a shared hole orthogonal solution in the future (for example, connectors have a 1.8 mm column pitch and a 3.6 mm pair pitch within each column). The footprint may be "invisible" electrically, so reflection losses and crosstalk can be as close to "zero" as possible. Reflection losses are minimized if footprint impedance is close to connector and trace impedances.

This can be used for an 85 ohm connector solution. SI advantages of 85 ohm traces/connectors/footprints in a 100 ohm solution may be provided, then this could be a big selling point (and would save development/tooling costs of offering 100 and ohm connectors). Crosstalk is minimized (theoretically zero) when adjacent signal antipads are oriented perpendicular to one another; larger ground pins help here also. The larger ground pins offer a mechanical advantage also. Extra retention force is provided. Pre-alignment occurs for the smaller signal pins during connector application of the signal contacts 28, 29 to their corresponding through-holes 50. Differential routing is possible.

All adjacent antipads may be perpendicular to minimize crosstalk. The footprint as seen in FIG. 6 may be square, so lateral routability is the same as vertical routability:

- 0.40 mm finished signal via (0.50 mm drill; 0.75 mm pad; 1.00 mm antipad diameter/width)
- 0.50 mm finished ground via (0.60 mm drill; 0.85 mm pad)
- 1.8 mm column pitch
- 3.6 mm pair pitch within each column
- 0.88 mm separation between adjacent antipads (this is not the narrowest portion of the routing channel)
- 1.456 mm centerline spacing between each signal via and the closest ground via; this translates to roughly a 0.53 mm wide routing channel between antipads and ground pads; this should allow for tightly coupled 5 mil traces (5-5-5) or loosely coupled 4 mil (4-6-4) trace routing; a 3 mil separation is assumed between any traces and any pads/antipads 0.63 mm separation between signal barrels 0.906 mm separation between signal barrel and adjacent ground barrels In a second type of example, the following might be provided 0.40 mm finished signal via (0.50 mm drill; 0.75 mm pad; 1.00 mm antipad diameter/width)

0.50 mm finished ground via (0.60 mm drill; 0.85 mm pad)

2.0 mm column pitch 4.0 mm pair pitch within each column

All adjacent antipads are perpendicular to minimize crosstalk

The footprint is perfectly square, so lateral routability is the same as vertical routability 1.26 mm separation between adjacent antipads (this is not the narrowest portion of the routing channel)

1.649 mm centerline spacing between each signal via and the closest ground via; this translates to roughly a 0.72 mm wide routing channel between antipads and ground pads; this should allow for tightly coupled 7 mil traces (7-8-7) or loosely coupled 6 mil (6-10-6) trace routing; a 3 mil separation is assumed between any traces and any pads/antipads 0.63 mm separation between signal barrels 1.099 mm separation between signal barrel and adjacent ground barrels ADVANTAGES may include, for example:

Much more robust press-fit tails, and less likelihood to stub tails during connector application Lower footprint crosstalk due to perpendicular orientation of antipads Footprint requires fewer ground via's Larger via's will allow for thicker backplanes, and lower plating aspect ratios Lateral routing is possible Because pair pitch is twice the column pitch, the concept lends itself to an orthogonal configuration Higher linear signal density 63.5 pairs per inch of card edge for 5 pair (1" card pitch)

In one type of example an electrical connector may be provided comprising a front housing 22 and frame 24; a plurality of ground contacts 26 connected to the frame 24; and a plurality of signal contacts 28, 29 connected to the frame 24, where the signal contacts comprise differential signal pairs. The ground and signal contacts each comprise first ends 30 at a first side of the frame 24 and opposite second ends 32 at a second side of the frame 24 to form a right angle connector with the front housing 22. The first ends 30 comprise a first group of three generally parallel rows including the first ends of the ground contacts in a center row 34, the first ends of a first one of the signal contacts of each differential signal pair of the group on a first side row 36 at a first side of the center row, and first ends of a second one of the signal contacts of the differential signal pairs of the group on a second side row 38 at a second opposite side of the center row, where at least one of the first ends of the ground contacts 26 is provided between the first ends of two of the differential signal pairs 28, 29 of the group.

The first ends of the ground contacts 26 may be larger than the first ends of the signal contacts 28, 29. The ground contacts 26 of the group may comprise a length of the first ends which are each shorter in length than a length of the first ends of the signal contacts 28, 29 of the group. The signal contacts 28, 29 of each differential signal pair are aligned at an angle of about 45 degrees relative to an axis along the center row. The signal contacts 28, 29 of each differential signal pair S+, S− may be aligned at an angle relative to the center row, and each of the differential signal pairs are aligned parallel to each other. The first ends 30 comprise a second group of three generally parallel rows including the first ends of the ground contacts of the second group in a center row, the first ends of a first one of the signal contacts of each differential signal pair of the second group on a first side row at a first side of the center row, and first ends of a second one of the signal contacts of the differential signal pairs of the second group on a second side row at a second opposite side of the center row, where at least one of the first ends of the ground contacts of the second group is provided between the first ends of two of the differential signal pairs of the second group, and where the two groups are generally parallel to each other with the signal contacts of each differential signal pair of the second group being aligned at an angle relative to the center row of the second group, and each of the differential signal pairs of the second group being aligned generally perpendicular to a corresponding one of the differential signal pairs of the first group. The electrical connector may comprise a plurality of Insert Molded Leadframe Assemblies (IMLAs) 20, where each IMLA comprises an insert molded frame which forms a portion of the housing, and at least one of the IMLAs comprise the first group.

In another example, an assembly may be provided comprising the electrical connector as described above and a printed circuit board having the electrical connector mounted thereon, where the printed circuit board comprises a group of through-holes with the first ends mounted in the through-holes, where pairs of the through-holes, which each have one of the differential signal pairs, each have a shared single antipad 56. The antipads 56 may each have a general elongated oval shape. The antipads 56 comprise rows of the antipads, where the antipads in adjacent rows are angled relative to each other. The antipads 56 in the adjacent rows may be generally orthogonal relative to each other. The printed circuit board may comprise conductor routing channels 58, 60 from the through-holes which extend from at least two generally orthogonal sides 54, 56 of the group of through-holes such that lateral routing is provided.

In one type of example, an assembly may be provided comprising a printed circuit board comprising rows of electrical connector contact holes in a group; and a right angle electrical connector mounted to the printed circuit board, where the electrical connector comprises ground contacts and signal contacts, where the signal contacts form a plurality of differential signal pairs, where first ends of the ground and signal contacts are provided at a first side of the electrical connector and project into the electrical connector contact holes of the printed circuit board, where the printed circuit board comprises a single antipad at two of the contact holes for each of the differential signal pairs, where each of the antipads has a general elongated shape, where the general elongate shape of each of the antipads in one row of the antipads is generally perpendicular to the general elongated shape of a corresponding one of the antipads in an adjacent row of the antipads.

The antipads may each have a general elongated oval shape. The printed circuit board may comprise conductor routing channels from the contact holes of the signal contacts which extend from at least two generally orthogonal sides of the group of contact holes such that lateral routing is provided. The first ends of the ground contacts may be larger than the first ends of the signal contacts. The ground contacts may comprise a length of their first ends which are each shorter in length than a length of the first ends of the signal contacts. The signal contacts of each differential signal pair may be aligned at an angle of about 45 degrees relative to an axis along a corresponding center row of first ends of the ground contacts. The first ends of each differential signal pair in a row of the pairs may be aligned at an angle relative to a corresponding center row of the first ends of the ground contacts, and each of the differential signal pairs are aligned parallel to each other.

One example method comprises providing a printed circuit board comprising rows of electrical connector contact holes; and connecting a right angle electrical connector to the printed circuit board, where the right angle electrical connector is mounted to the printed circuit board with first ends of ground and signal contacts of the electrical connector being located in respective ones of the electrical connector contact holes, where the signal contacts form a plurality of differential signal pairs, where the printed circuit board is provided with a single antipad at two of the holes for each of the differential signal pairs, where each of the antipads has a general elongate shape, where the general elongate shape of the antipads at one of the rows of holes is generally perpendicular to the antipads at an adjacent one of the rows of holes.

Figure 9:
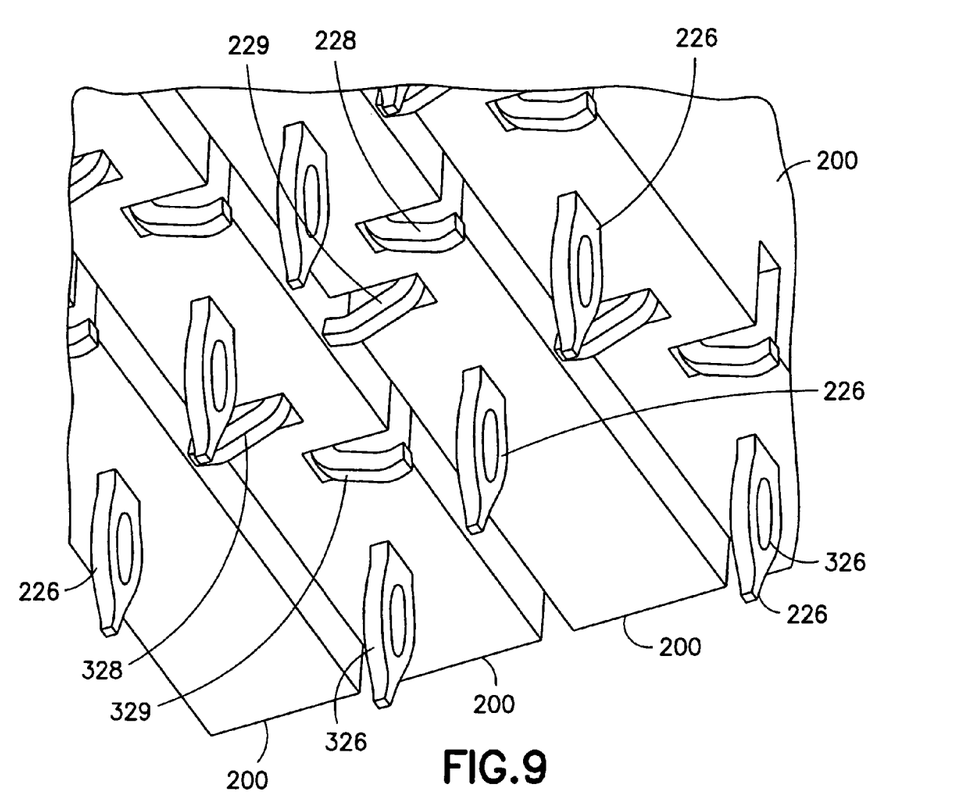
FIG. 9 is a partial perspective view of the bottom ends of side-by-side IMLAs of an alternate example.
Figure 9A:
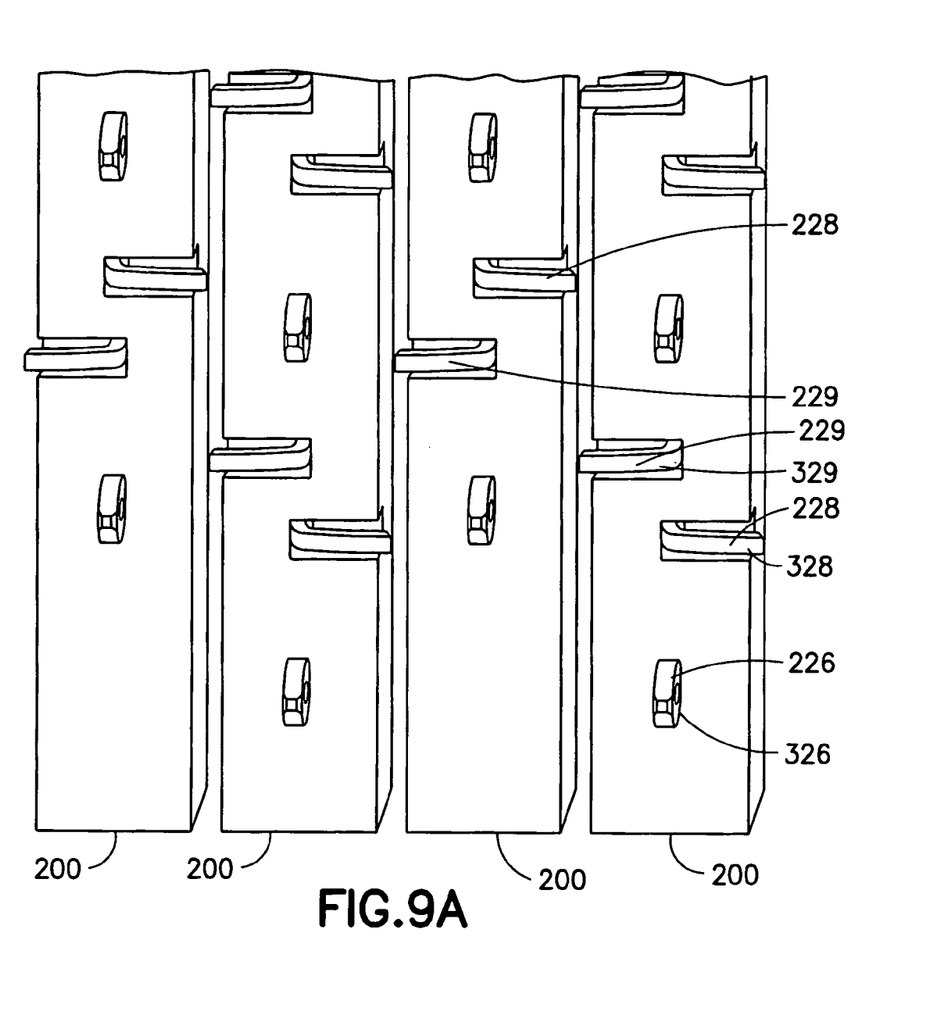
FIG. 9A is a bottom plan view of the IMLAs shown in FIG. 9.

Referring also to FIGS. 9 and 9A, portions of an alternate example of the IMLAs 200 are shown. In this example each IMLA 200 has ground contacts 226 and signal contacts 228, 229. The tails 326 of the ground contacts 226 are through-hole tails. The tails 328, 329 of the signal contacts 228, 229, on the other hand, are surface mount tails. The tails 328, 329 are deflectable when being mounted to a printed circuit board. This provides a hybrid approach with press-fit ground pins and compression-mount signal tails.

This example still provides a IMLA having a group of three generally parallel rows of contact tails including the first ends of the ground contacts in a center row, the first ends of a first one of the signal contacts of each differential signal pair of the group on a first side row at a first side of the center row, and first ends of a second one of the signal contacts of the differential signal pairs of the group on a second side row at a second opposite side of the center row, where at least one of the first ends of the ground contacts is provided between the first ends of two of the differential signal pairs of the group, where the first ends and the housing are configured to be directly mounted to a first printed circuit board, and where the second ends and the housing are configured to removably connect to a mating electrical connector on a second printed circuit board.

Figure 10:
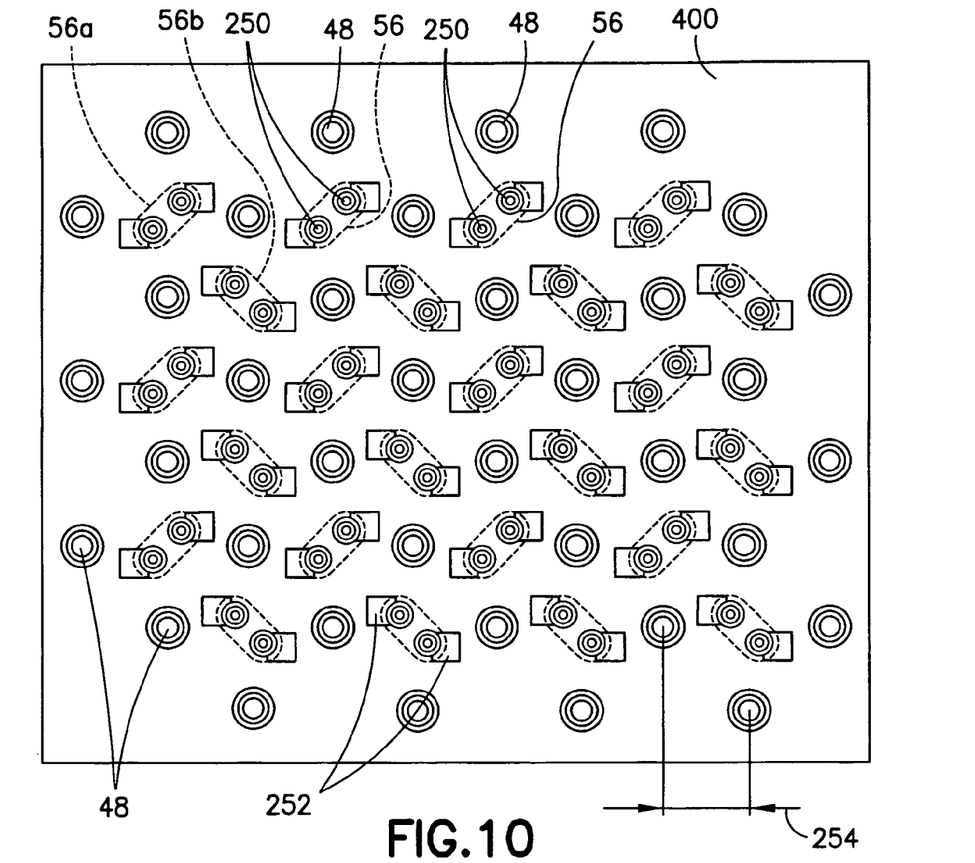
FIG. 10 is a top plan view of a portion of the daughter printed circuit boards similar to FIG. 6, for the IMLA assembly shown in FIG. 9.

Referring also to FIG. 10, a top view of a printed circuit board 400 is shown similar to FIG. 6 for use with the IMLAs 200 shown in FIG. 9. This example permits much smaller signal vias or second through-holes 250 versus the vias 50 shown in FIG. 6. This example embodiment improves footprint signal lead performance. Impedance up to 100Ω is possible. Footprint cross-talk may be near zero. Via sizes can be adjusted based on an impedance target without a change to the connector. This permits bi-directional routing (such as 6-9-6 or 7-7-7 for example). This also permits easier connector repair versus a soldered connection. This may translate directly to an orthogonal mid-plane connector solution.

Each pair of the signal vias 250 form a differential signal pair of via with a diagonal antipad 56. Each signal via 250 may have a surface mount pad 252 on the top surface of the board 400. The tails 328, 329 may compress against the top surface of a respective one of the pads 252. The spacing 254 between centerline rows of the tails of the contacts in adjacent IMLAs may be about 1.8 mm for example. Similar to the example embodiment shown in FIG. 6, the printed circuit board 400 is provided with a single antipad at two of the holes for each of the differential signal pairs, where each of the antipads 56 has a general elongate shape, where the general elongate shape of the antipads 56a at one of the rows of holes is generally perpendicular to the antipads 56b at an adjacent one of the rows of holes.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An electrical connector comprising:

a housing;

a plurality of ground contacts connected to the housing; and a plurality of signal contacts connected to the housing, where the signal contacts comprise differential signal pairs, where the ground and signal contacts each comprise first ends at a first side of the housing and opposite second ends at a second side of the housing to form a right angle connector, where the first ends comprise a first group of three generally parallel rows including the first ends of the ground contacts in a center row, the first ends of a first one of the signal contacts of each differential signal pair of the group on a first side row at a first side of the center row, and first ends of a second one of the signal contacts of the differential signal pairs of the group on a second side row at a second opposite side of the center row, where at least one of the first ends of the ground contacts is provided between the first ends of two of the differential signal pairs of the group, where the first ends and the housing are configured to be directly mounted to a daughter printed circuit board, and where the second ends and the housing are configured to removably connect to a mating electrical connector on a mother printed circuit board, where the second ends of the plurality of ground contacts and the second ends of the plurality of signal contacts are aligned in a common single row.

2. An electrical connector as in claim 1 where the signal contacts of each differential signal pair are aligned at an angle of about 45 degrees relative to an axis along the center row.

3. An electrical connector as in claim 1 where the signal contacts of each differential signal pair are aligned at an angle relative to the center row, and each of the differential signal pairs are aligned parallel to each other.

4. An electrical connector as in claim 3 where the first ends comprise a second group of three generally parallel rows including the first ends of the ground contacts of the second group in a center row, the first ends of a first one of the signal contacts of each differential signal pair of the second group on a first side row at a first side of the center row, and first ends of a second one of the signal contacts of the differential signal pairs of the second group on a second side row at a second opposite side of the center row, where at least one of the first ends of the ground contacts of the second group is provided between the first ends of two of the differential signal pairs of the second group, and where the two groups are generally parallel to each other with the signal contacts of each differential signal pair of the second group being aligned at an angle relative to the center row of the second group, and each of the differential signal pairs of the second group being aligned generally perpendicular to a corresponding one of the differential signal pairs of the first group.

5. An electrical connector as in claim 1 where the electrical connector comprises a plurality of Insert Molded Leadframe Assemblies (IMLAs), where each IMLA comprises an insert molded frame which forms a portion of the housing, and at least one of the IMLAs comprise the first group.

6. An assembly comprising:
   the electrical connector as in claim 1; and
   a daughter printed circuit board having the electrical connector mounted thereon, where the daughter printed circuit board comprises a group of through-holes with the first ends mounted in the through-holes, where pairs of the through-holes, which each have one of the differential signal pairs, each have a shared single antipad.

7. An assembly as in claim 6 where the antipads each have a general elongated oval shape.

8. An assembly as in claim 7 where the antipads comprise rows of the antipads, where the antipads in adjacent rows are angled relative to each other.

9. An assembly as in claim 8 where the antipads in the adjacent rows are generally orthogonal relative to each other.

10. An assembly as in claim 6 where the printed circuit board comprises conductor routing channels from the through-holes which extend from at least two generally orthogonal sides of the group of through-holes such that lateral routing is provided.

11. An assembly comprising:
    a daughter printed circuit board comprising rows of electrical connector contact holes in a group; and
    an electrical connector directly mounted to the daughter printed circuit board, where the electrical connector comprises ground contacts and signal contacts, where the signal contacts form a plurality of differential signal pairs, where first ends of the ground and signal contacts are provided at a first side of the electrical connector and project into the electrical connector contact holes of the printed circuit board,
    where the printed circuit board comprises a single antipad at two of the contact holes for each of the differential signal pairs, where each of the antipads has a general elongated shape, where the general elongate shape of each of the antipads in one row of the antipads is generally perpendicular to the general elongated shape of a corresponding one of the antipads in an adjacent row of the antipads.

12. An assembly as in claim 11 where the antipads each have a general elongated oval shape.

13. An assembly as in claim 11 where the printed circuit board comprises conductor routing channels from the contact holes of the signal contacts which extend from at least two generally orthogonal sides of the group of contact holes such that lateral routing is provided.

14. An assembly as in claim 11 where the first ends of the ground contacts are larger than the first ends of the signal contacts.

15. An assembly as in claim 11 where the ground contacts comprise a length of their first ends which are each shorter in length than a length of the first ends of the signal contacts.

16. An assembly as in claim 11 where the signal contacts of each differential signal pair are aligned at an angle of about 45 degrees relative to an axis along a corresponding center row of first ends of the ground contacts.

17. An assembly as in claim 11 where the first ends of each differential signal pair in a row of the pairs are aligned at an angle relative to a corresponding center row of the first ends of the ground contacts, and each of the differential signal pairs are aligned parallel to each other.

18. A method comprising:
    providing a daughter printed circuit board comprising rows of electrical connector contact holes; and
    connecting a right angle electrical connector to the daughter printed circuit board, where the right angle electrical connector is mounted to the daughter printed circuit board with first ends of ground and signal contacts of the electrical connector being located in respective ones of the electrical connector contact holes, where the signal contacts form a plurality of differential signal pairs,
    where the daughter printed circuit board is provided with a single antipad at two of the holes for each of the differential signal pairs, where each of the antipads has a general elongate shape, where the general elongate shape of the antipads at one of the rows of holes is generally perpendicular to the antipads at an adjacent one of the rows of holes.

19. An electrical connector comprising:
    a housing;
    a plurality of ground contacts connected to the housing; and
    a plurality of signal contacts connected to the housing, where the signal contacts comprise differential signal pairs,
    where the ground and signal contacts each comprise first ends at a first side of the housing and opposite second ends at a second side of the housing to form a right angle connector,
    where the first ends comprise a first group of three generally parallel rows including the first ends of the ground contacts in a center row, the first ends of a first one of the signal contacts of each differential signal pair of the group on a first side row at a first side of the center row, and first ends of a second one of the signal contacts of the differential signal pairs of the group on a second side row at a second opposite side of the center row, where at least one of the first ends of the ground contacts is provided between the first ends of two of the differential signal pairs of the group, where the first ends and the housing are configured to be directly mounted to a daughter printed circuit board, and where the second ends and the housing are configured to removably connect to a mating electrical connector on a mother printed circuit board,
    where the first ends of the ground contacts are larger than the first ends of the signal contacts.

20. An electrical connector comprising:
    a housing;
    a plurality of ground contacts connected to the housing; and
    a plurality of signal contacts connected to the housing, where the signal contacts comprise differential signal pairs,
    where the ground and signal contacts each comprise first ends at a first side of the housing and opposite second ends at a second side of the housing to form a right angle connector,
    where the first ends comprise a first group of three generally parallel rows including the first ends of the ground contacts in a center row, the first ends of a first one of the signal contacts of each differential signal pair of the group on a first side row at a first side of the center row, and first ends of a second one of the signal contacts of the differential signal pairs of the group on a second side row at a second opposite side of the center row, where at least one of the first ends of the ground contacts is provided between the first ends of two of the differential signal pairs of the group, where the first ends and the housing are configured to be directly mounted to a daughter printed circuit board, and where the second ends and the housing are configured to removably connect to a mating electrical connector on a mother printed circuit board, where the ground contacts of the group comprise a length of the first ends which are each shorter in length than a length of the first ends of the signal contacts of the group.

* * * * *